United States Patent [19]

Shinoda et al.

[11] 4,153,906

[45] May 8, 1979

[54] INTEGRATED CIRCUIT USING AN INSULATED GATE FIELD EFFECT TRANSISTOR

[75] Inventors: Masaichi Shinoda, Sagamihara; Tetsuo Nakamura, Machida; Minoru Yamamoto, Yokohama, all of Japan

[73] Assignee: Fujitsu Limited, Japan

[21] Appl. No.: 853,852

[22] Filed: Nov. 22, 1977

[30] Foreign Application Priority Data

Dec. 7, 1976 [JP] Japan .................. 51/146860

[51] Int. Cl.² .......................................... H01L 29/78
[52] U.S. Cl. ........................................ 357/23; 357/90

[58] Field of Search .................................. 357/23, 90

Primary Examiner—Edward J. Wojciechowicz
Attorney, Agent, or Firm—Staas & Halsey

[57] ABSTRACT

This disclosure relates to an integrated circuit using an insulated gate field effect transistor of the punch-through type for use in high speed electronic computation. Until now the punch-through phenomena has been considered a defect in the insulated gate field effect transistor. However, the effective utilization of the punch-through phenomena is achieved by using a specially designed insulated gate field effect transistor having a selected structure or material.

11 Claims, 6 Drawing Figures

INTEGRATED CIRCUIT USING AN INSULATED GATE FIELD EFFECT TRANSISTOR

BACKGROUND OF THE INVENTION

This invention relates generally to an integrated circuit using an insulated gate field effect transistor and, more particularly, to an integrated circuit which effectively utilizes an electrical current conduction due to a punch-through phenomena in an insulated gate field effect transistor. This invention is useful for an integrated circuit in which a high speed operation is particularly required.

The enhancement type MOS field effect transistor, as the most general type of insulated gate field effect transistor, is suitable as a transistor to be used in an integrated circuit for an electronic computing circuit (logic circuit). However, attempts to improve the operational characteristics by shortening the channels of the MOS field effect transistor have been hindered by a so-called punch-through phenomena.

The punch-through current due to the punch-through phenomena has the characteristics that: this current flows not only on the surface but also in deep layers of semiconductor substrate, which causes an increase of the cross section of the electric current and an increase of the carrier mobility; the carrier transits in a high voltage electrical field, which causes a high saturation velocity of a carrier, and; the impurity atom concentration in the substrate can be rendered small which causes less stray capacitance of the device. These characteristics are suitable for high speed operation of a transistor.

In spite of the above-mentioned favourable characteristics, the practical utilization of the punch-through phenomena has been deemed to be difficult, because it has been considered that the nature of the punch-through current is not of the normally-off type, the control of the switching of the punch-through current by the gate is impossible, and the design of the device is not easy due to the need for linear representation of the two-dimentional phenomena of the punch-through current.

SUMMARY OF THE INVENTION

It is an object of this invention to provide an integrated circuit having a high operational speed by means of effectively utilizing a punch-through phenomena of the insulated gate field effect transistor.

It is another object of this invention to provide an integrated circuit using an insulated gate field effect transistor of punch-through type having a normally-off characteristic, which has been considered to be impossible to realize until now.

It is a further object of this invention to provide integrated logic circuits for electronic computations including a punch-through type insulated gate field effect transistor.

DESCRIPTION OF THE PREFERRED EMBODIMENTS

Figure 1:
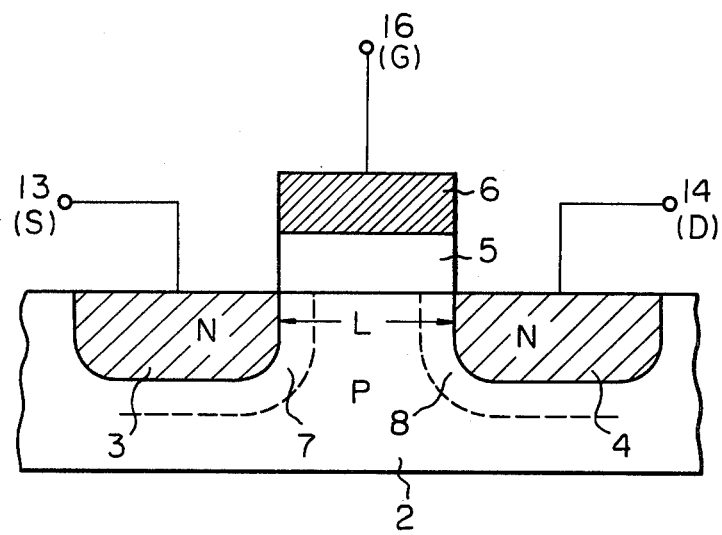
FIG. 1 is a cross-sectional view of an MOS field effect transistor.

Referring now to FIG. 1, there is shown an MOS field effect transistor comprising a P-type semiconductor substrate 2 and two N-type regions 3 and 4 which serve as source and drain regions, respectively. An insulating layer 5 of silicon dioxide, for example, is located on the surface of the semiconductor substrate 2, and a metallic layer 6 is located on the surface of said insulating layer 5. A source terminal 13 and a drain terminal 14 are connected to the source region 3 and the drain region 4, respectively. A gate terminal 16 is connected to the metallic layer 6.

In the above described MOS field effect transistor, a punch-through phenomena can occur if the spacing between the source region and the drain region is selected to be small in order to gain high operating speed characteristics. This phenomena is often discussed in connection with the so-called short-channel MOS field effect transistor. The reason for the occurrance of a punch-through phenomena is explained as follows. That is, as the potential difference between source and drain increases depletion layers 7 and 8, which are formed outside of the source region 3 and drain region 4, respectively, expand towards each other so that the two depletion layers 7 and 8 come in contact, or; the height of the hump in the curve representing electrical potential between the source region and the drain region becomes smaller so that the electrons in the source or drain region are able to jump over the hump.

This punch-through phenomena has been considered to be undesirable for an MOS field effect transistor. However, this invention effectively utilizes this punch-through phenomena.

The punch-through current due to the punch-through phenomena has characteristics suitable for a high speed operation of the transistor because of the following reasons. That is, a large cross-section of an electric current path and a large mobility of carriers are attainable because the punch-through current flows not only on the surface but also in deep layers of a solid material; a high saturation velocity of carriers is attainable because the carrier transits in a high voltage electrical field, and; less stray capacitance is attainable because the impurity atom concentration in the substrate can be rendered small.

Although the above-mentioned characteristics of the punch-through current may be valuable, the realization of a transistor having a high operational speed utilizing the punch-through current has been regarded as difficult, because it has been considered that; the nature of the punch-through current is not of the normally-off type; the control of the punch-through current by the gate is impossible, and; the design of the device is not easy due to the need for linear representation of the two-dimentional phenomena of the punch-through current.

Figure 2:
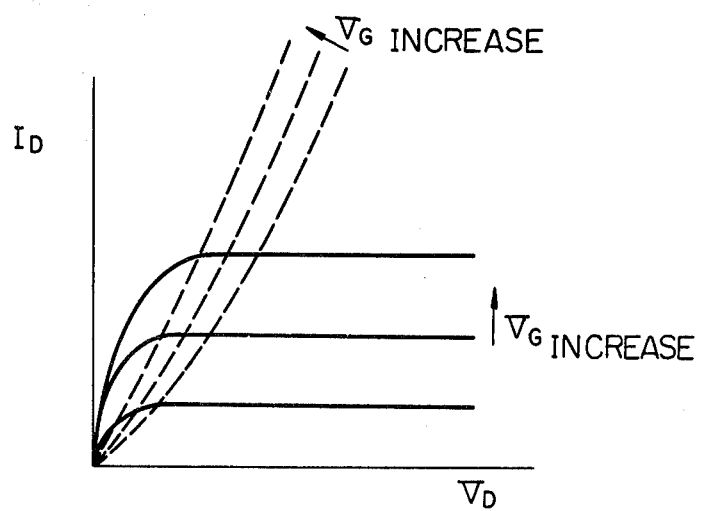
FIG. 2 shows the general $V_D$-$I_D$ characteristics of an MOS field effect transistor.

In FIG. 2 the relationship between the drain voltage $V_D$ and the drain current $I_D$ of a conventional normally-off type MOS field effect transistor is shown. The saturation value of $I_D$ increases as the gate voltage $V_G$ increases. Therefore, the value of the drain current $I_D$ can be controlled by the gate voltage $V_G$. However, the punch-through current represented by a broken line in FIG. 2 has a characteristic of a rapid increase of $I_D$. Therefore, the control by gate voltage $V_G$ is difficult because the change of gate voltage $V_G$ does not cause any effective change of drain current $I_D$. (Such a control is dispensable for the switching devices in logical circuits.)

Figure 3:
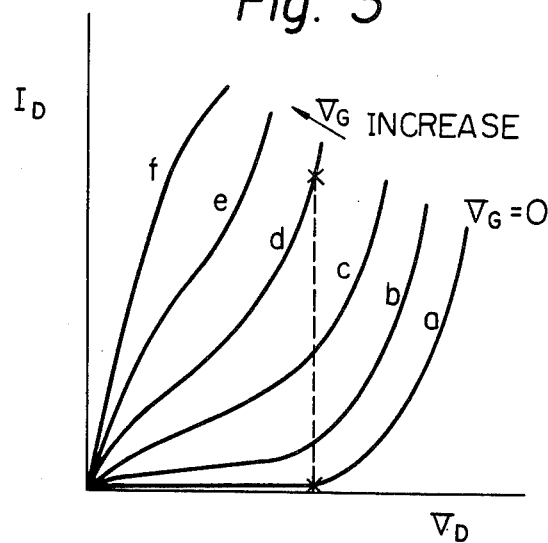
FIG. 3 shows the $V_D$-$I_D$ characteristics of the punch-through current of the punch-through type MOS field effect transistor in accordance with this invention.

According to the present invention, the $V_D$-$I_D$ characteristics of the punch-through current in FIG. 2 are changed to those shown in FIG. 3. The punch-through current in FIG. 3 has the normally-off characteristic on the curve "a", representing $I_D$ under the condition $V_G=0$. Furthermore, with respect to the punch-through current in FIG. 3, the control by gate voltage $V_G$ is possible, because the effective change of $I_D$ can be attained by changing $V_G$, as shown in the distribution of curves a, b, c, d, e and f. Thus, the characteristics of the punch-through current in FIG. 3 are the basis of the punch-through type insulated gate field effect transistor in accordance with the present invention. (These characteristics enable the transistor to switch between conductive and non-conductive conditions, which is essential to logical circuits.)

The characteristics of the punch-through current illustrated in FIG. 3 can be expressed as follows. In an integrated circuit using an insulated gate field effect transistor, when the gate potential is approximately the same as the source potential, any current channel, such as an inversion layer, under the gate, is not formed, so that said transistor is kept non-conductive, and; when the gate is supplied with the potential of the same polarity as that of the drain, the punch-through state is established between the source and the drain, so that said transistor is rendered conductive. The characteristics of FIG. 3 can be attained by, for example, a selected distance between the source region and the drain region, a selected thickness of the insulated layer under the gate, or a selected impurity atom concentration in the substrate.

Examples of the data of the punch-through type insulated gate field effect transistor in accordance with the present invention, the drain of said transistor being connected to a conventional enhancement type MOS field effect transistor, are as follows.

EXAMPLE 1

| | |
|---|---|
| Substrate Material | P Type Silicon |
| Impurity Atom Concentration in Substrate ($N_A$) | $7 \times 10^{15}$ cm$^{-3}$ |
| Impurity Atom Concentration in N Type Source and Drain | $10^{20}$ cm$^{-3}$ |
| Diffusion Depth of Source and Drain ($X_j$) | 0.2 μ |
| Thickness of Gate Insulator SiO$_2$ Layer ($t_{ox}$) | 1000 A |
| Length of Gate (Distance between Source and Drain Regions of Transistor) | 1.5 μ |
| Width of Gate | 10 μ |
| Supply Voltage ($V_{DD}$) | 9 V |
| Delay Time (D) | 223 ps/Gate |
| Power-Delay Product (PD) | 1.02 pJ |

EXAMPLE 2

| | |
|---|---|
| Substrate Material | P Type Silicon |
| Impurity Atom Concentration ($N_A$) | $1.2 \times 10^{16}$ cm$^{-3}$ |
| Impurity Atom Concentration in N Type Source and Drain | $10^{20}$ cm$^{-3}$ |
| Diffusion Depth of Source and Drain ($X_j$) | 0.2 μ |
| Thickness of Gate Insulator SiO$_2$ Layer ($t_{ox}$) | 350 A |
| Length of Gate | 1 μ |
| Width of Gate | 7 μ |
| Delay Time (D) | $99 \times 10^{-12}$ s/Gate for Supply Voltage ($V_{DD}$) =5V $75 \times 10^{-12}$ s/Gate for Supply Voltage ($V_{DD}$)=8.2V |
| Power-Delay Product (PD) | 206 fJ for Supply Voltage ($V_{DD}$)=5V 453 fJ for Supply Voltage ($V_{DD}$)=8.2V |

Figures 4A, 4B, 4C:
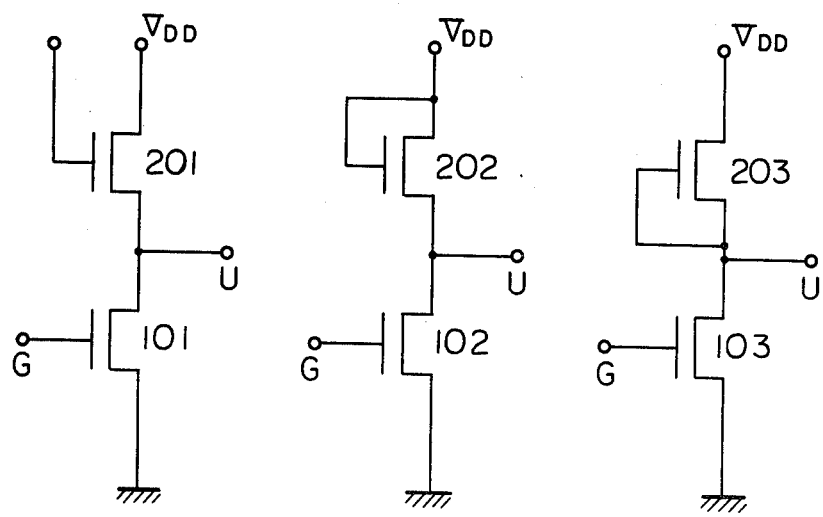
FIG. 4, FIG. 5 and FIG. 6 show various types of logic circuits consisting of the integrated circuits of this invention.
Figure 5A:
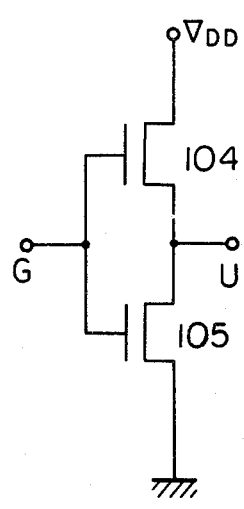
Figure 5B:
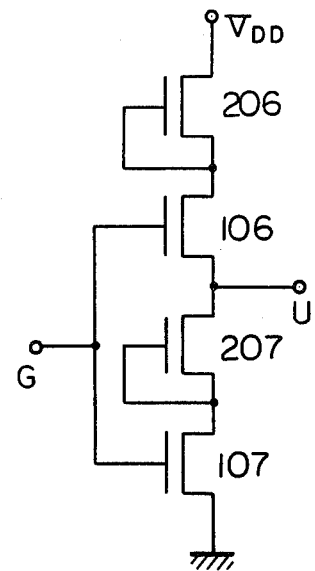
Figure 6A:
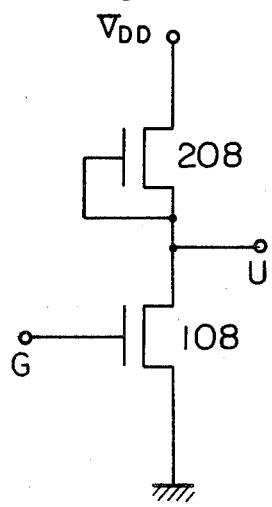
Figure 6B:
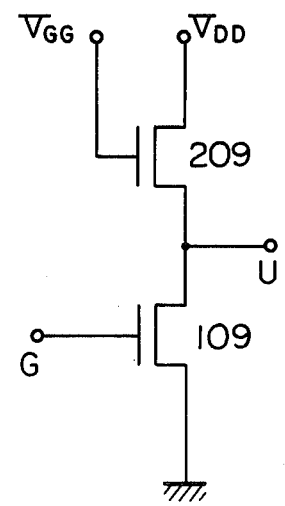

FIG. 4, FIG. 5 and FIG. 6 show examples of logic circuits consisting of an integrated circuit using a punch-through type insulated gate field effect transistor according to the present invention.

In FIG. 4, the punch-through type insulated gate field effect transistors 101, 102 and 103 are connected at the drain terminal thereof to the enhancement type MOS field effect transistor 201, 202 and the depletion type MOS field effect transistor 203, respectively.

In FIG. 5(a), two punch-through type insulated gate field effect transistors 104, 105, of P- and N-type, respectively, are connected in series, the gates of said two transistors being connected in parallel. In FIG. 5(b), the drain terminals of two punch-through type insulated gate field effect transistors 106, 107 are connected to the depletion type MOS field effect transistors 206 and 207, respectively. Each of FIG. 5(a) and (b) is called a complementary circuit.

In FIG. 6, the punch-through type MOS field effect transistors 108 and 109 according to the present invention are connected at the drain terminals thereof to punch-through type MOS field effect transistors 208 and 209, respectively.

Each of these circuits shown in FIG. 4, FIG. 5 and FIG. 6 operates as an inverter receiving an input signal at a gate terminal G and producing an inverted output signal at an output terminal U.

What is claimed is:

1. An integrated circuit using an insulated gate field effect transistor of the punch-through type, in which said insulated gate field effect transistor is formed in a semiconductor substrate of a predetermined conductivity type and has a source electrode, gate electrode, and a drain electrode, said source and drain electrodes located in different regions of the surface of said substrate, and said gate electrode located on a gate insulating layer formed on said semiconductor substrate between said source and drain electrodes, wherein the impurity concentration in said semiconductor substrate, and the channel length between said source and drain electrodes, and the thickness of said gate insulating layer are selected such that said insulated gate field effect transistor is rendered non-conductive in the absence of a gate voltage applied to said gate electrode, and said insulated gate field effect transistor is rendered conductive due to the punch-through effect between said source and drain electrodes when a gate voltage of a predetermined polarity is applied to said gate electrode.

2. An integrated circuit using an insulated gate field effect transistor of the punch-through type in accordance with claim 1 wherein said insulated gate field effect transistor is connected to a depletion type field effect transistor load.

3. An integrated circuit using an insulated gate field effect transistor of the punch-through type in accordance with claim 2 wherein said insulated gate field effect transistor is arranged in a complementary circuit which is formed of a N-channel punch-through type insulated gate field effect transistor and a series connected P-channel punch-through type insulated gate field effect transistor, the gates of said N- and P-channel punch-through type insulated gate field effect transistors being connected in parallel.

4. An integrated circuit using an insulated gate field effect transistor of the punch-through type in accordance with claim 1 wherein said insulated gate field effect transistor is connected to another punch-through type insulated gate field effect transistor used as a load.

5. An integrated circuit using an insulated gate field effect transistor of the punch-through type in accordance with claim 1 wherein said insulated gate field effect transistor is arranged in a complementary circuit which is formed of a N-channel punch-through type insulated gate field effect transistor and a series connected P-channel punch-through type insulated gate field effect transistor, the gates of said N- and P-channel punch-through type insulated gate field effect transistors being connected in parallel.

6. An integrated circuit in accordance with claim 1, wherein said insulated gate field effect transistor has a range of impurity atom concentration in its substrate of from $7 \times 10^{15}$ cm$^{-3}$ to $1.2 \times 10^{16}$ cm$^{-3}$.

7. An integrated circuit in accordance with claim 6, wherein said insulated gate field effect transistor has a range of distance between its source and its drain of from $1\mu$ to $1.5\mu$.

8. An integrated circuit in accordance with claim 6, wherein said insulated gate field effect transistor has a range of thickness of its gate insulator of from 350Å to 1000Å.

9. An integrated circuit in accordance with claim 1, wherein said insulated gate field effect transistor has a range of distances between its source and its drain of from $1\mu$ to $1.5\mu$.

10. An integrated circuit in accorance with claim 1, wherein said insulated gate field effect transistor has a range of thickness of its gate insulator of from 350Å to 1000Å.

11. An integrated circuit in accordance with claim 10, wherein said insulated gate field effect transistor has a range of distance between its source and its drain of from $1\mu$ to $1.5\mu$.

* * * * *

UNITED STATES PATENT OFFICE
CERTIFICATE OF CORRECTION

Patent No. 4,153,906          Dated May 8, 1979

Inventor(s) Masaichi Shinoda et al.

It is certified that error appears in the above-identified patent and that said Letters Patent are hereby corrected as shown below:

Column 3, line 54, "1000A" should be --1000Å--.

Column 4, line 2, "350A" should be --350Å--.

Column 6, line 17, "accorance" should be --accordance--.

Signed and Sealed this

Thirty-first Day of July 1979

[SEAL]

Attest:

LUTRELLE F. PARKER
*Attesting Officer*    *Acting Commissioner of Patents and Trademarks*